United States Patent [19]

Theall, Jr.

[11] Patent Number: 4,998,079

[45] Date of Patent: Mar. 5, 1991

[54] BI-DIRECTIONAL SIGNAL COUPLER FOR A BALANCED DATA TRANSMISSION LINE

[75] Inventor: C. Earle Theall, Jr., Weston, Conn.

[73] Assignee: Plessey Electronic Systems Corp., Wayne, N.J.

[21] Appl. No.: 464,539

[22] Filed: Jan. 16, 1990

[51] Int. Cl.⁵ .............................................. H03H 7/00
[52] U.S. Cl. ..................................... 333/112; 333/119; 375/36; 379/443
[58] Field of Search ...................... 333/112, 119, 12, 4, 333/5; 178/69 A, 69 B, 69 C; 375/36; 379/443

[56] References Cited

U.S. PATENT DOCUMENTS

| | | | |
|---|---|---|---|
| 4,467,293 | 8/1984 | Apel | 333/112 |
| 4,555,681 | 11/1985 | Dominick et al. | 333/112 |
| 4,707,673 | 11/1987 | Lee et al. | 333/112 |

FOREIGN PATENT DOCUMENTS 130201 10/1980 Japan ..................... 333/112

Primary Examiner—Paul Gensler
Attorney, Agent, or Firm—David L. Davis

[57] ABSTRACT

A coupler for a balanced two wire data transmission line includes input and output ports as well as a forward coupled port and a reflected coupled port. The coupler is constructed of passive components including transformers and resistors to provide at the forward coupled port a signal proportional to the signal transmitted from a source to a load and provide at the reflected coupled port a signal proportional to the magnitude of the signal reflected from the load due to mismatch.

7 Claims, 4 Drawing Sheets

BI-DIRECTIONAL SIGNAL COUPLER FOR A BALANCED DATA TRANSMISSION LINE

BACKGROUND OF THE INVENTION

This invention relates to balanced data transmission lines and, more particularly, to a bi-directional signal coupler for use therewith.

Data bus systems are well known and commonly used to connect a plurality of peripheral devices for communication between the devices and/or a central control unit. Such data bus systems can either be of the unbalanced or balanced type. In a typical unbalanced bus system, a single wire connects all of the peripheral devices and the central control unit. Data signals travel along the single wire, with the common ground of the system providing the return path. In a typical balanced bus system, there are two wires with one of the wires carrying the data signals and the other wire providing the return path. The present invention is concerned with such a two wire balanced data bus system. In particular, such a system typically is formed of a twisted pair of wires enclosed within a shield.

In such a bus system, it is often difficult to isolate bus signal voltage component problems and the causes of possible distortions. Service technicians must be able to determine when a signal deviates from ideal, whether the problem is caused by the load, the source, the line, or a reflection. It is therefore a primary object of this invention to provide a coupler to aid in such discrimination.

Bus systems of the type described are also sensitive to common mode effects, that is, signals that are common to both balanced lines. Such signals can arise, for example, from RF induction or conductive effects. It is therefore a further object of this invention to provide a coupler of the type described which cancels the common mode signals.

SUMMARY OF THE INVENTION

The foregoing, and additional, objects are attained in accordance with the principles of this invention by providing a bi-directional coupler interposed in a balanced two wire transmission line, the coupler comprising an input port having first and second input terminals connected to respective wires of the transmission line, an output port having first and second output terminals connected to respective wires of the transmission line, a forward coupled port having a forward port terminal, a first load resistor connected between the forward port terminal and ground, a reflected coupled port having a reflected port terminal, a second load resistor connected between the reflected port terminal and ground, a first transformer having a primary winding connected between the first input terminal and the first output terminal and a secondary winding connected between the forward port terminal and ground, a second transformer having a primary winding connected between the second input terminal and the second output terminal and a secondary winding connected between the reflected port terminal and ground, a third transformer having a primary winding connected across the first and second output terminals and a secondary winding having a first end connected to ground, a first resistor connected between the forward port terminal and the second end of the third transformer secondary winding, and a second resistor connected between the reflected port terminal and the second end of the third transformer secondary winding. The first, second and third transformers are poled so as to produce an additive effect at the forward port terminal and a cancelling effect at the reflected port terminal.

In accordance with an aspect of this invention, the coupler further includes a fourth transformer having a primary winding connected in series with the primary winding of the first transformer and a secondary winding connected in series with the secondary winding of the second transformer, and a fifth transformer having a primary winding connected in series with the primary winding of the second transformer and a secondary winding connected in series with the secondary winding of the first transformer. The fourth transformer is poled to provide an additive effect with the second transformer secondary winding and the fifth transformer is poled to provide an additive effect with the first transformer secondary winding. Accordingly, common mode signals present in the two wires of the transmission line are eliminated from the forward and reflected coupled ports.

BRIEF DESCRIPTION OF THE DRAWINGS

The foregoing will be more readily apparent upon reading the following description in conjunction with the drawings in which like elements have the same reference numeral and wherein.

DETAILED DESCRIPTION

Figure 1:
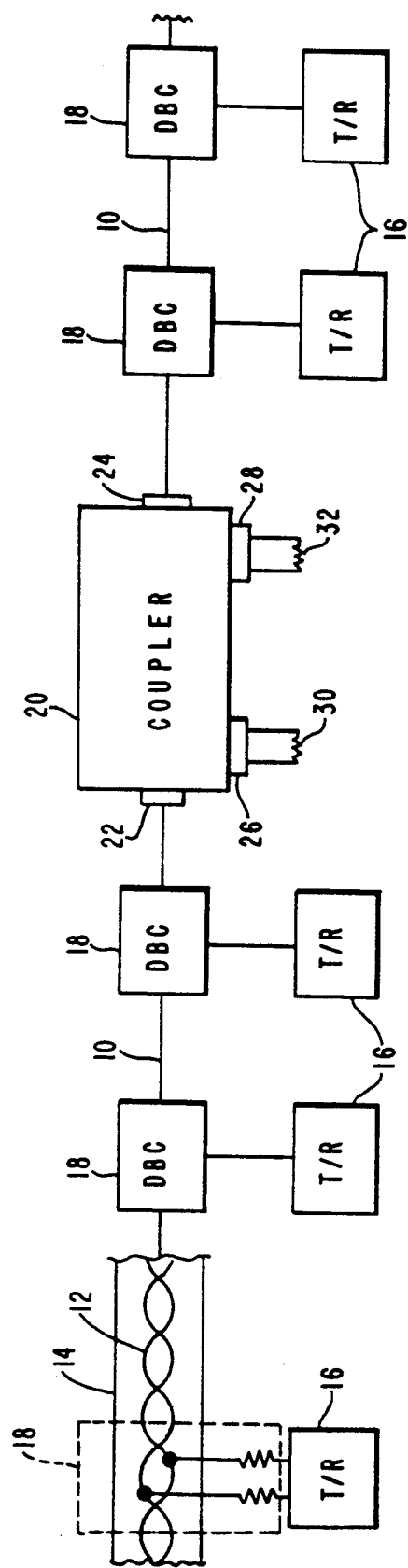
FIG. 1 schematically depicts a data bus system in which a coupler according to this invention is installed.

Referring now to the drawings, FIG. 1 schematically illustrates a data bus system of the type in which a coupler according to this invention is contemplated for use. The data bus system illustratively includes a bus 10 comprised of a twisted wire pair 12 surrounded by a shield 14. The bus 10 is routed over a predetermined path and at various locations along the path it is connected to transceiver units (T/R) 16 via data bus couplers (DBC) 18. Each of the transceiver units 16 has the capability of receiving signals transmitted along the bus 10 or transmitting signals over the bus 10, in accordance with a preestablished hierarchy, which is well known in the art and will not be described in detail herein.

In order to assist a service technician in discovering and isolating line faults, measuring line characteristics such as voltage standing wave ratio (VSWR) and reflection coefficient and performing other tests on the bus 10, a coupler 20 constructed in accordance with the principles of this invention is inserted in the bus 10. For purposes of illustration, it will be assumed that data signals travel along the bus 10 from left to right, as viewed in the drawings. Therefore, in accordance with the above, signals traveling along the bus 10 from left to right will be referred to as forward, or incident, signals and signals traveling along the bus 10 from right to left will be referred to as reflected signals.

The coupler 20 is a four port device. It includes an input port 22, an output port 24, a forward coupled port 26, and a reflected coupled port 28. The input and output ports 22, 24 each have two terminals for connecting to respective ones of the twisted wire pair 12. Each of the forward and reflected coupled ports 26, 28 has a respective load resistor 30, 32 by means of which a technician may take line measurements. The signal at the forward coupled port 26 is representative of the incident voltage applied to the bus 10. This is the line signal that would be present if the line and system were perfectly terminated and matched. The signal at the forward coupled port 26 always indicates this matched condition signal regardless of load variations or disruptions of any kind. The signal at the reflected coupled port 28 is representative of the voltage which is reflected from the line or load mismatches of the system at the output port 24. In other words, the signal at the reflected coupled port 28 represents the portion of the line signal which is not doing useful work at the load.

Figure 2:
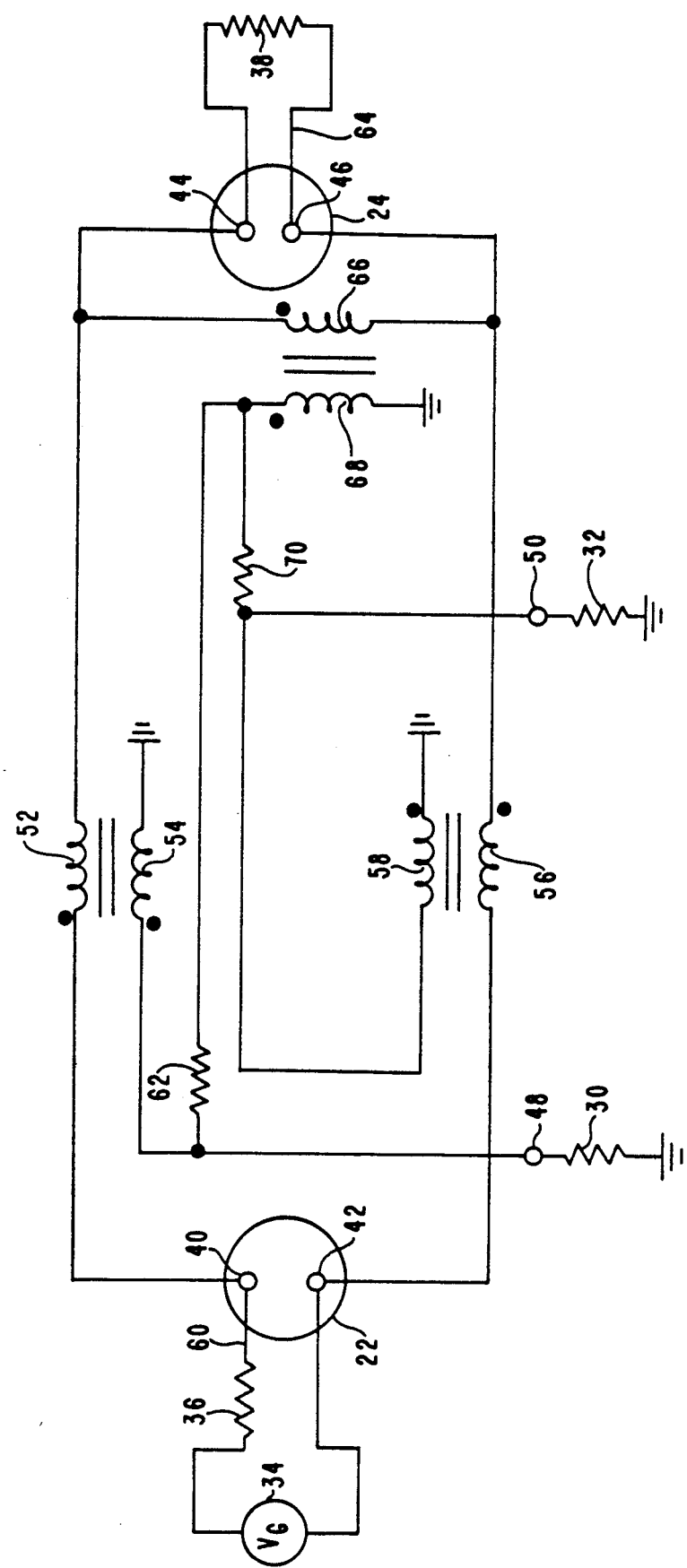
FIG. 2 is a schematic circuit diagram showing a first embodiment of a coupler according to this invention.

FIG. 2 illustrates a first embodiment of a bi-directional coupler constructed in accordance with the principles of this invention. This coupler is shown as being connected between a voltage generator 34, having an internal resistance 36, and a load 38. The portion of the transmission line between the input port 22 and the generator 34 has a characteristic resistance $R_o$, as does the portion of the transmission line between the output port 24 and the load 38.

As shown in FIG. 2, the coupler includes the input port 22 having first and second input terminals 40 and 42, respectively, and the output port 24 having first and second output terminals 44 and 46, respectively. The load resistor 30 of the forward coupled port 26 is connected between the forward port terminal 48 and ground. Likewise, the load resistor 32 of the reflected coupled port is connected between the reflected port terminal 50 and ground. Included within the coupler is a first transformer having a primary winding 52 connected between the first input terminal 40 and the first output terminal 44 and a secondary winding 54 connected between the forward port terminal 48 and ground. A second transformer has its primary winding 56 connected between the second input terminal 42 and the second output terminal 46 and its secondary winding 58 connected between the reflected port terminal 50 and ground.

Preferably, the values of the resistors 30 and 32 are equal to the characteristic resistance $R_o$ of the transmission line and for a −20 db coupler, the turns ratios of the first and second transformers are 1:10. Therefore, the signal from the generator 34 which is transmitted down the line 60 to and through the coupler and to the load 38 results in a current through the secondary winding 54 equal to 0.1 times the value of the current in the line 60. This current is divided between the resistor 30 and the resistor 62 which preferably also has a value equal to the characteristic resistance $R_o$. Accordingly, 0.05 times the line current flows through the resistor 30 coupled to the forward port terminal 48. The same current returning over the lead 64 from the load 38 is transformed by the second transformer in the same manner to provide 0.05 times the line current through the resistor 32.

The coupler also includes a third transformer having a primary winding 66 connected across the output terminals 44 and 46 and a secondary winding 68 having a first end connected to ground. The resistor 62 is connected between the second end of the secondary winding 68 and the forward port terminal 48 and a resistor 70, also preferably having a value equal to the characteristic resistance $R_o$, is connected between the second end of the secondary winding 68 and the reflected port terminal 50. The turns ratio of the third transformer is 10:1 so that, assuming a properly matched load 38, the current induced in the secondary winding 68 is divided between the resistors 62 and 70. The first and third transformers are so poled that they produce an additive effect through the resistor 30 and the second and third transformers are so poled that they produce a cancelling effect through the resistor 32. Accordingly, if the load 38 is properly matched to the line, no voltage will appear at the reflected port terminal 50. At the forward port terminal 48, the voltage will be 0.1 times, or −20 db from, the incident voltage component of the line voltage. If the load 38 were not properly matched, the voltage appearing at the reflected port terminal 50 would have also been at 0.1 times, or −20 db from, the reflected component of the line voltage.

For any load impedance, matched or mismatched to the system characteristic impedance, the forward coupled voltage will be the same constant value relative to the voltage of the generator 34. However, for load impedance variations, the reflected coupled voltage will vary in sign, phase and magnitude with the reflection coefficient. The absolute value of the reflection coefficient is zero for a matched resistive load and is one for a complete mismatch reflection. Therefore a matched load will produce zero voltage reflection, while an open or short circuit load or a completely reactive load will reflect all the voltage, as no power is then absorbed by the load. In summary, the secondary windings 54 and 58 are current sources proportional to the line current and the secondary winding 68 is a voltage source proportional to the line voltage. The current from the winding 54 and the voltage from the winding 68 are additive at the resistor 32. The current from the winding 58 and the voltage from the winding 68 are of phase and magnitude to produce zero volts across the resistor 32 for a matched load condition.

Figure 3:
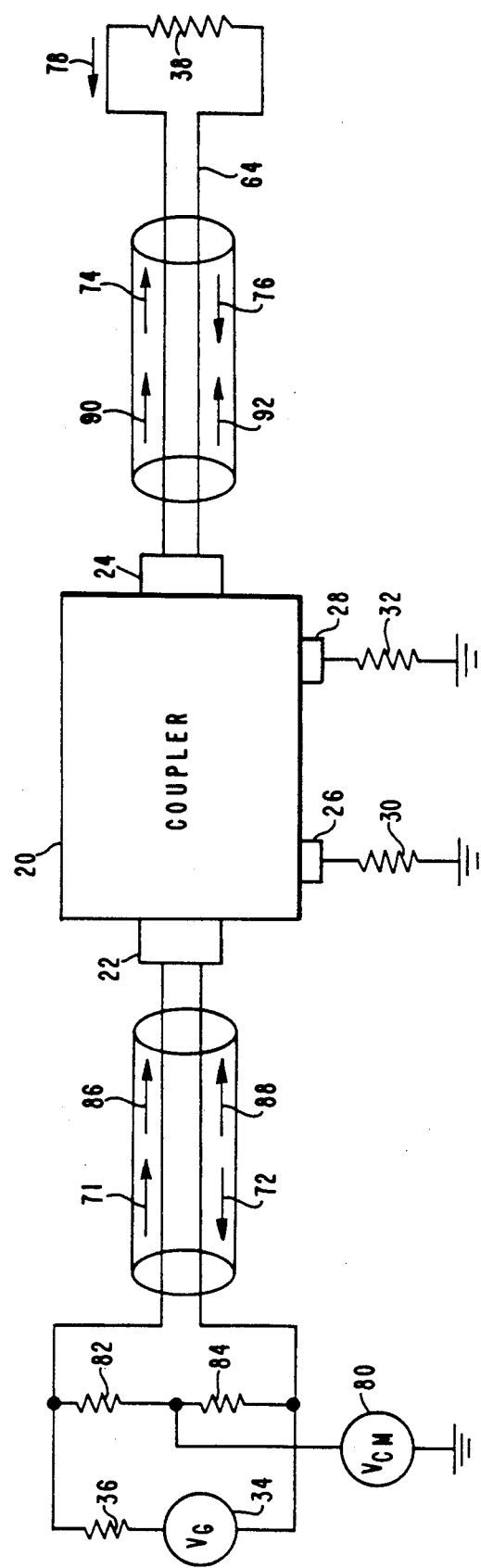
FIG. 3 illustrates the coupler shown in FIG. 2 in a data bus in which line currents, including those due to unwanted common mode effects, are shown.

A common motive for using balanced twin lines in data buses is the desire to improve isolation of the receiving device against common mode line signals, whether caused by RF induction or conductive effects. Common mode rejection is an item in the specifications of data bus systems, as common mode signals are expected components of this product environment. The coupler shown in FIG. 2 functions in the proper manner for differential signals, coupling the incident and reflected line voltage components to the respective forward and reflected coupled ports. However, the coupler shown in FIG. 2 also couples common mode line signals to these ports and the common mode signals effectively mask the expected signals at the coupled ports, which signals would otherwise be sensitive, clear indications of line and load conditions. For example, the indication of good load match to characteristic impedance is a voltage null at the coupler's reflected coupled port. FIG. 3 illustrates the coupler 20 installed in a data bus and shows the line currents, including those due to the unwanted common mode effects.

As shown in FIG. 3, the line current of the desired differential signal due to the generator 34 is indicated by the arrows 71, 72, 74, and 76. The mismatched reflected differential signal current is indicated by the arrow 78. The generator 80, along with the resistors 82 and 84 represents the injection of an unwanted common mode signal, the currents due to which are indicated by the arrows 86, 88, 90 and 92.

Figure 4:
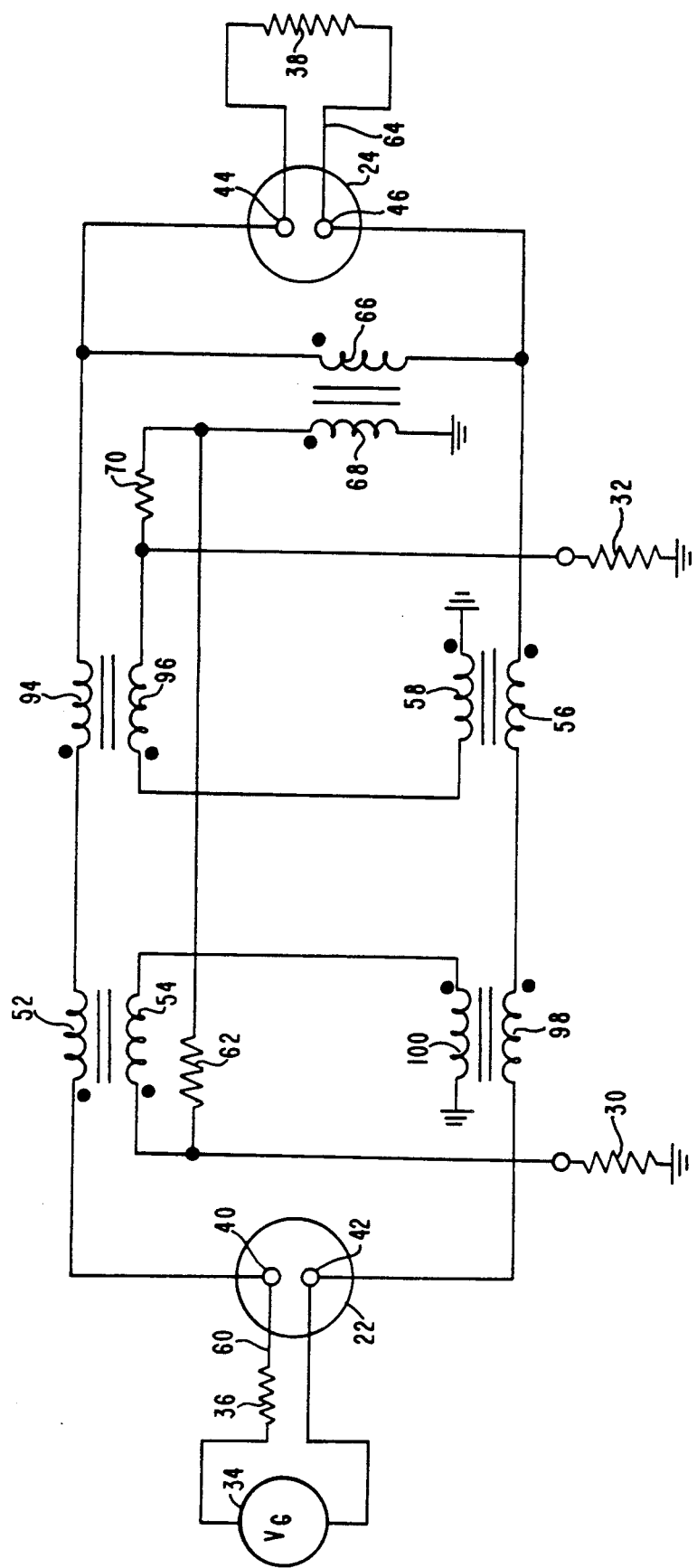
FIG. 4 is a schematic circuit diagram showing a second embodiment of a coupler according to this invention.

FIG. 4 illustrates an embodiment of a bi-directional coupler constructed in accordance with the principles of this invention which eliminates the effects of the unwanted common mode signals. The coupler shown in FIG. 4 is similar to the coupler shown in FIG. 2 but with the addition of components which cancel out the common mode signals. In particular, a fourth transformer is provided having its primary winding 94 in series with the primary winding 52 of the first transformer, and its secondary winding 96 connected in series with the secondary winding 58 of the second transformer. Similarly, a fifth transformer is provided having its primary winding 98 connected in series with the primary winding 56 of the second transformer and its secondary winding 100 connected in series with the secondary winding 54 of the first transformer. The fourth and fifth transformers are poled so that they provide an additive effect with the secondary windings of the second and first transformers, respectively. Further, the turns ratios of the fourth and fifth transformers are equal to the turns ratios of the first and second transformers. The effect of the fourth and fifth transformers is still to provide the same proportion of the line currents to the forward and reflected coupled ports. However, for a common mode signal generating equal currents, each flowing in the same direction from the generator toward the load in each of the two balanced lines, the fourth and fifth transformers have cancelling, opposing effects such that no signals relating to the common mode line currents appear at the load resistors 30 and 32.

The coupler 20 is functionally symmetrical in the sense that if the positions of the source 34 and the load 38 are interchanged relative to the coupler 20, the coupler 20 still functions as before. However, the roles of the ports are interchanged, with the port 22 becoming the output port, the port 24 becoming the input port, the port 26 becoming the reflected coupled port, and the port 28 becoming the forward coupled port. The coupler 20 is bi-directional because in a given connection it simultaneously and separately represents the two line wave components of both directions, i.e., the incident or forward wave from source to load and the reflected wave, reflected from the load back towards the source.

Accordingly, there has been disclosed an improved bi-directional signal coupler for a balanced data transmission line. While illustrative embodiments of the present invention have been disclosed herein, it will be apparent to those of ordinary skill in the art that various modifications and adaptations to those embodiments are possible and it is only intended that the present invention be limited by the scope of the appended claims.

I claim:

1. A bi-directional coupler interposed in a balanced two wire transmission line susceptible to unwanted common mode signals comprising:
   an input port;
   an output port;
   means for providing a two wire connection between said input and output ports;
   a forward coupled port;
   a reflected coupled port;
   means for providing at said forward coupled port a signal having a magnitude which is proportional to the magnitude of the signal being transmitted through said coupler from said input port to said output port;
   means for providing at said reflected coupled port a signal having a magnitude which is proportional to the magnitude of the signal being transmitted through said coupler from said output port to said input port; and
   means for eliminating said common mode signals from the signals provided at the forward and reflected coupled ports.

2. A bi-directional coupler interposed in a balanced two wire transmission line, comprising:
   an input port having first and second input terminals connected to respective wires of the transmission line;
   an output port having first and second output terminals connected to respective wires of the transmission line;
   a forward coupled port having a forward port terminal;
   a first load resistor connected between said forward port terminal and ground;
   a reflected coupled port having a reflected port terminal;
   a second load resistor connected between said reflected port terminal and ground;
   a first transformer having a primary winding connected between said first input terminal and said first output terminal and a secondary winding connected between said forward port terminal and ground;
   a second transformer having a primary winding connected between said second input terminal and said second output terminal and a secondary winding connected between said reflected port terminal and ground;
   a third transformer having a primary winding connected across said first and second output terminals and a secondary winding having a first end connected to ground;
   a first resistor connected between said forward port terminal and the second end of said third transformer secondary winding; and
   a second resistor connected between said reflected port terminal and the second end of said third transformer secondary winding;
   the first, second and third transformers being poled so as to produce an additive effect at said forward port terminal and a cancelling effect at said reflected port terminal.

3. The coupler according to claim 2 wherein the transmission line has a characteristic resistance $R_o$ and the values of said first load resistor, said second load resistor, said first resistor and said second resistor are all equal to the characteristic resistance $R_o$.

4. The coupler according to claim 3. wherein said first and second transformers have the same turns ratio and said third transformer has a turns ratio reciprocal to that of said first and second transformers.

5. The coupler according to claim 2 further including:
   a fourth transformer having a primary winding connected in series with the primary winding of said first transformer and a secondary winding connected in series with the secondary winding of said second transformer; and
   a fifth transformer having a primary winding connected in series with the primary winding of said second transformer and a secondary winding connected in series with the secondary winding of said first transformer;

the fourth transformer being poled to provide an additive effect with the second transformer secondary winding and the fifth transformer being poled to provide an additive effect with the first transformer secondary winding;

whereby common mode signals present in the two wires of the transmission line are eliminated from the forward and reflected coupled ports.

6. The coupler according to claim 5 wherein the transmission line has a characteristic resistance $R_o$ and the values of said first load resistor, said second load resistor, said first resistor and said second resistor are all equal to the characteristic resistance $R_o$.

7. The coupler according to claim 5 wherein said first, second, fourth and fifth transformers have the same turns ratio and said third transformer has a turns ratio reciprocal to that of said first, second, fourth and fifth transformers.

* * * * *